(12) United States Patent
Hsu et al.

(10) Patent No.: US 10,436,818 B2
(45) Date of Patent: Oct. 8, 2019

(54) PROBE MODULE HAVING CANTILEVER MEMS PROBE AND METHOD OF MAKING THE SAME

(71) Applicant: MPI CORPORATION, Hsinchu Shien (TW)

(72) Inventors: Yu-Chen Hsu, Hsinchu Shien (TW); Yu-Wen Wang, Hsinchu Shien (TW); Horng-Kuang Fan, Hsinchu Shien (TW); Mao-Fa Shen, Hsinchu Shien (TW)

(73) Assignee: MPI CORPORATION, Chu-Pei, Hsinchu Shien (TW)

( * ) Notice: Subject to any disclaimer, the term of this patent is extended or adjusted under 35 U.S.C. 154(b) by 183 days.

(21) Appl. No.: 15/652,972

(22) Filed: Jul. 18, 2017

(65) Prior Publication Data

US 2018/0024163 A1    Jan. 25, 2018

(30) Foreign Application Priority Data

Jul. 25, 2016 (TW) .............................. 105123481 A

(51) Int. Cl.
*G01R 1/067* (2006.01)
*G01R 1/20* (2006.01)
*G01R 3/00* (2006.01)

(52) U.S. Cl.
CPC ..... *G01R 1/06727* (2013.01); *G01R 1/06744* (2013.01); *G01R 1/20* (2013.01); *G01R 3/00* (2013.01)

(58) Field of Classification Search
CPC .. G01R 3/00; G01R 1/06727; G01R 1/06744; G01R 1/20

USPC .............. 324/750.01–754.26, 500, 401, 405, 324/755.01, 755.07, 755.11, 756.03, 324/758.01, 690, 696, 715, 724

See application file for complete search history.

(56) References Cited

U.S. PATENT DOCUMENTS

| | | | |
|---|---|---|---|
| 2001/0004556 A1* | 6/2001 | Zhou ................ | G01R 1/06711 439/66 |
| 2015/0362551 A1* | 12/2015 | Saunders ........... | G01R 1/06716 438/15 |

FOREIGN PATENT DOCUMENTS

| | | |
|---|---|---|
| TW | 200741214 A | 11/2007 |
| TW | 200912325 A | 3/2009 |
| TW | 201129807 A | 9/2011 |
| TW | 201239362 A | 10/2012 |

* cited by examiner

*Primary Examiner* — Melissa J Koval
*Assistant Examiner* — Trung Nguyen
(74) *Attorney, Agent, or Firm* — Muncy, Geissler, Olds & Lowe, PC

(57) ABSTRACT

A method of making a cantilever MEMS probe module includes the steps of forming a cantilever MEMS probe on a first surface of a circuit substrate by a MEMS fabrication process in a way that the cantilever MEMS probe has a support post electrically and mechanically connected with an electric contact of the first surface, a cantilever arm connected with the support post, and a needle connected with the cantilever arm, and forming a through hole penetrating through the first surface and a second surface opposite to the first surface of the circuit substrate and corresponding in position to the needle and a part of the cantilever arm by using a cutting tool to cut the circuit substrate from the second surface toward the first surface of the circuit substrate. A probe module made by the method is disclosed too.

14 Claims, 7 Drawing Sheets

PROBE MODULE HAVING CANTILEVER MEMS PROBE AND METHOD OF MAKING THE SAME

BACKGROUND OF THE INVENTION

1. Field of the Invention

The present invention relates generally to a probe module of a probe card for testing a device under test (hereinafter referred to as "DUT"), and relates more particularly to a probe module having cantilever probes made by a microelectromechanical system (hereinafter referred to as "MEMS") fabrication process, and a method of making the probe module.

2. Description of the Related Art

A conventional cantilever probe module comprises generally a circuit substrate and a plurality of cantilever probes disposed on a bottom surface of the circuit substrate. Each cantilever probe is usually composed of a cantilever arm, a needle extending downwardly from an end of the cantilever arm, and a support post extending upwardly from the other end of the cantilever arm and electrically and mechanically connected with an electric contact provided on the bottom surface of the circuit substrate. The support post is configured to keep the cantilever arm at a distance from the bottom surface of the circuit substrate, thereby preventing the cantilever arm from bumping against the circuit substrate when the cantilever arm receives an external force and then curvedly bent. To achieve this goal, the support post of the cantilever probe needs to be designed and made with a considerable, high-enough height.

For a cantilever MEMS probe module, the cantilever MEMS probes of the module are formed on the bottom surface of the circuit substrate by a well-known MEMS fabrication process, which forms a plurality of sacrifice layers on the bottom surface of the circuit substrate layer by layer as well as the support posts, the cantilever arms and the needles of the probes in the sacrifice layers by electroplating layer by layer. To smoothly perform such MEMS fabrication process, the circuit substrate needs to be configured having a flat, complete bottom surface; however, in this way, no tolerance space for receiving the bent cantilever MEMS probe can be provided on the bottom surface. Under this circumstance, the support post needs to be formed with a considerable height greater than the maximum overdrive (i.e., probing stroke) of the probe under testing so as to ensure that the cantilever arm will not bump against the circuit substrate when the cantilever arm reaches its maximum extent of deformation. To build the aforesaid cantilever probe having such high support post, the MEMS fabrication process becomes complicated and time-consuming, resulting in high manufacturing cost and unstable quality in making the cantilever MEMS probe module.

In prior arts, there are known fabrication processes providing recesses on the circuit substrate for accommodating curvedly bent cantilever MEMS probes. For example, Taiwan patent No. I413775 (publication No. 201129807) discloses a cantilever MEMS probe manufacturing method, which forms successively a conductive layer and a sacrifice layer in a concave slot recessed on a surface of a circuit substrate so as to temporarily fill up the concave slot. Thereafter, the cantilever MEMS probe is formed on the sacrifice layer and the surface of the circuit substrate layer by layer. After the cantilever MEMS probe is completely made, the sacrifice layer and the conductive layer need to be removed from the concave slot so as to expose and enable the concave slot to accommodate the bent cantilever MEMS probe. This cantilever MEMS probe manufacturing method is too complicated.

SUMMARY OF THE INVENTION

The present invention has been accomplished in view of the above-noted circumstances. It is an objective of the present invention to provide a method of making a probe module having one or more cantilever MEMS probes, which can be conveniently carried out in a time-saving and low-cost manner to make the cantilever MEMS probe have a short support post that can still prevent the probe from bumping against the circuit substrate.

Another objective of the present invention is to provide a method of making a probe module having one or more cantilever MEMS probes, which can produce a probe module that is adapted for testing an image sensing device, such as CMOS image sensor (CIS).

To attain the above-mentioned objectives, the present invention provides a method of making a cantilever MEMS probe module, which comprises the following steps of:

a) providing a circuit substrate having a first surface on which an electric contact is provided, and a second surface opposite to the first surface;

b) forming a cantilever MEMS probe on the first surface of the circuit substrate by a MEMS fabrication process in a way that the cantilever MEMS probe has a support post electrically and mechanically connected with the electric contact of the first surface, a cantilever arm connected with the support post, and a needle connected with the cantilever arm; and c) forming a through hole penetrating through the first and second surfaces of the circuit substrate and aiming at the needle and a part of the cantilever arm by using a cutting tool to cut the circuit substrate from the second surface toward the first surface.

By using this method, before the step c) is performed, the first surface of the circuit substrate can be maintained in a flat and complete manner for facilitating proceeding further the step b). Further, the cantilever MEMS probe module thus obtained provides the circuit substrate with the through hole that can accommodate the curvedly bent cantilever arm due to an external force exerting thereon. That is, the method provided by the present invention does not adopt the complicated steps of forming a recess on the first surface of the circuit substrate, filling up the recess, and removing the filling material from the recess after the probe is completely made, which are adopted by the conventional method. As such, the cantilever MEMS probe can be made with a short support post, which can still prevent the cantilever arm from bumping against the circuit substrate, in a convenient, time-saving and low-cost way. Moreover, a testing light can pass through the through hole of the substrate and radiate on the needle of the probe, such that the cantilever MEMS module thus obtained can be used to test an image sensing device.

Preferably, in the step c) the through hole of the circuit substrate may be cut by the cutting tool in a way that a wall of the through hole is configured having a tip portion adjacent to the first surface of the circuit substrate, and a guiding surface extending from the tip portion towards the second surface of the circuit substrate, such that a diameter of the through hole of the circuit substrate gradually increases from the tip portion along the guiding surface.

More preferably, the guiding surface may be one of an arched surface and a flat surface. In this way, in a process of cleaning the probe, compressed gas can flow through the through hole to clean the needle in a such way the compressed gas is effectively conducted by the guiding surface toward the needle, thereby enhancing the probe cleaning effect.

Preferably, in the step b) a sacrifice layer may be formed on the first surface of the circuit substrate, such that the cantilever MEMS probe can be held by the sacrifice layer when the step c) is carried out, and the sacrifice layer can be removed after the step c). In this way, the cantilever MEMS probe can be firmly positioned on the circuit substrate by the sacrifice layer during the process that the step c) is carried out.

Preferably, in the step b) a plurality of cantilever MEMS probes may be formed on the first surface of the circuit substrate, and after the step c) the circuit substrate may be cut into a plurality of substrate blocks each having at least one cantilever MEMS probe. In this way, various probe modules can be made by the forgoing step a) to step c) and then cut and separated into individual ones, thereby enhancing manufacturing efficiency.

Still another objective of the present invention is to provide a probe module, which is adapted for probing an image sensing device, has a cantilever MEMS probe including a short support post that can still prevent the probe from bumping the circuit substrate, and can be made with a convenient, time-saving and low-cost manufacturing process.

To attain the above-mentioned objective, the present invention provides a MEMS probe module comprising a circuit substrate and a cantilever MEMS probe. The circuit substrate has a first surface on which an electric contact is provided, a second surface opposite to the first surface, and a through hole penetrating through the first and second surfaces. The cantilever MEMS probe is formed on the first surface of the circuit substrate by a MEMS fabrication process. The cantilever MEMS probe includes a support post electrically and mechanically connected with the electric contact of the first surface, a cantilever arm connected with the support post, and a needle connected with the cantilever arm. The through hole of the circuit substrate is configured in alignment with the needle and a part of the cantilever arm. When the cantilever arm of the cantilever MEMS probe receives an external force, the cantilever arm is curvedly bent with a bending value, which is defined as a distance that an end of the cantilever arm moves towards the second surface of the circuit substrate, and partially received in the through hole of the circuit substrate.

With the above-mentioned features, a testing light can pass through the through hole of the substrate and radiate on the needle of the probe, such that the cantilever MEMS module provided by the present invention can be used to test an image sensing device. Further, in a method of making the cantilever MEMS module of the present invention, the complicated steps of forming a recess on the first surface of the circuit substrate, filling up the recess, and removing the filling material after the probe is completely formed, which are adopted by the conventional method, are omitted, such that the cantilever MEMS module of the present invention can be made with a short support post, which can still prevent the cantilever arm from bumping against the circuit substrate, in a convenient, time-saving and low-cost way.

Preferably, a wall of the through hole may be configured having a tip portion adjacent to the first surface of the circuit substrate, and a guiding surface extending from the tip portion towards the second surface of the circuit substrate, such that a diameter of the through hole of the circuit substrate gradually increases from the tip portion along the guiding surface. With the aforesaid features, in a process of cleaning the probe, compressed gas can flow through the through hole to clean the needle in such a way that the compressed gas is effectively conducted and directed by the guiding surface toward the needle, thereby enhancing the probe cleaning effect. More preferably, the guiding surface may be one of an arched surface and a flat surface.

In an embodiment of the present invention, the wall of the through hole of the circuit substrate has a flat portion adjacent to the second surface of the circuit substrate with a uniform diameter. The guiding surface may be an arched surface extending from the tip portion to the flat portion. In another embodiment of the present invention, the guiding surface may be a flat surface extending from the tip portion to the second surface of the circuit substrate.

Preferably, a difference between the maximum radius and the minimum radius of the through hole of the circuit substrate may be greater than 40 micrometers and less than 200 micrometers.

Preferably, a distance between the tip portion of the through hole of the circuit substrate and the support post of the cantilever MEMS probe may be less than 600 micrometers.

Preferably, when the cantilever arm is not bent, a distance between the cantilever arm and the first surface of the circuit substrate may be less than a maximum overdrive of the cantilever MEMS probe. More preferably, the aforesaid distance between the cantilever arm and the first surface of the circuit substrate may be less than 100 micrometers when the cantilever arm is not bent.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
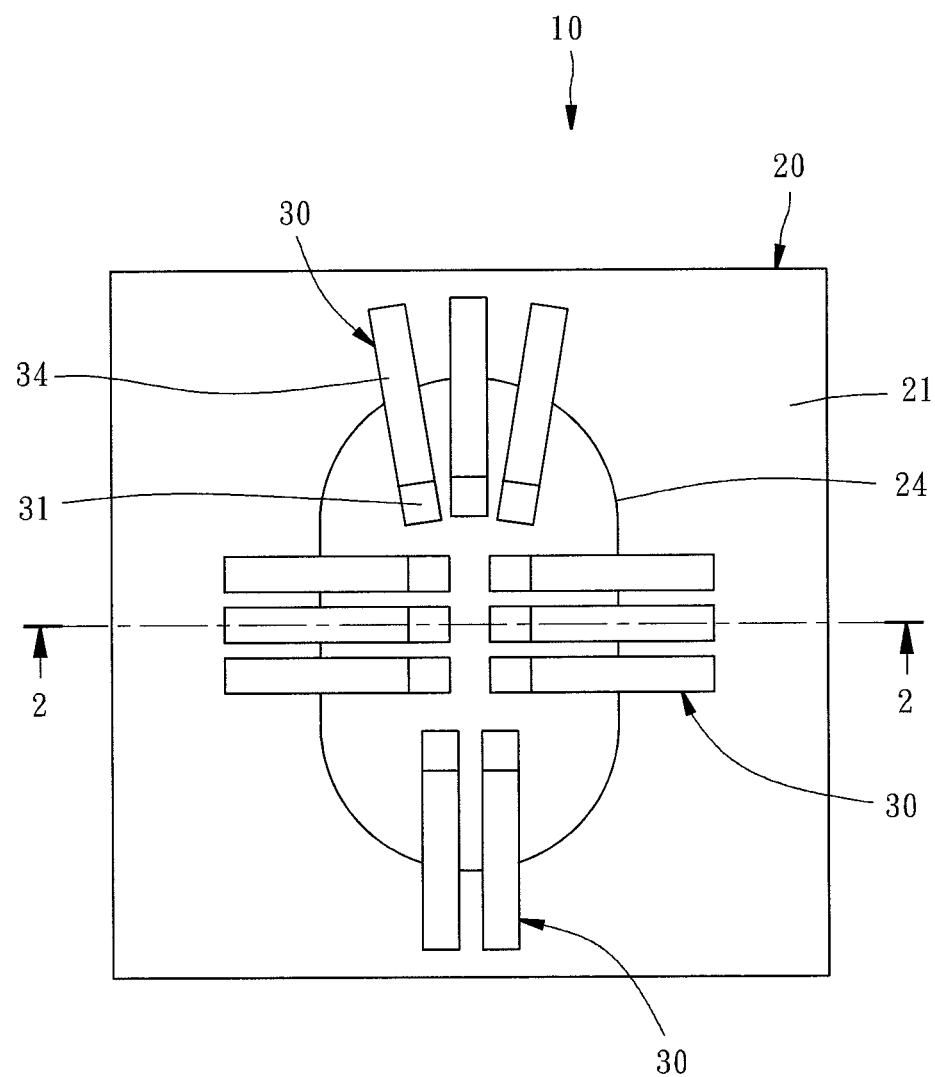
FIG. 1 is a bottom view of a cantilever MEMS probe module according to a first preferred embodiment of the present application.

First of all, it is to be mentioned that same reference numerals used in the following preferred embodiments and the appendix drawings designate same or similar elements throughout the specification for the purpose of concise illustration of the present invention.

Figure 2:
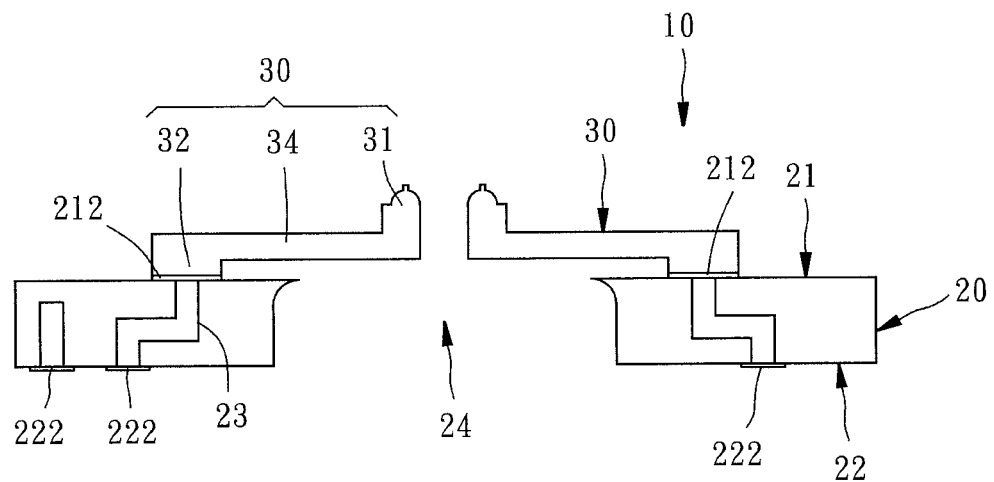
FIG. 2 is a sectional view taken alone line 2-2 of FIG. 1.

FIGS. 1 and 2 show a probe module 10, including cantilever probes 30 made by microelectromechanical system (MEMS) fabrication process, according to a first preferred embodiment of the present application. Hereinafter the aforesaid probe module 10 is referred to as the cantilever MEMS probe module 10, and the cantilever probe 30 is referred to as the cantilever MEMS probe. As shown in FIGS. 1 and 2, the cantilever MEMS probe module 10 comprises a circuit substrate 20 and eleven cantilever MEMS probes 30. It will be appreciated that the amount of the cantilever MEMS probes is not limited to be equal to eleven as disclosed in this embodiment. The cantilever MEMS probe module 10 of the present invention may have one or more cantilever MEMS probes.

The method of making the cantilever MEMS probe module 10 and the structure of the cantilever MEMS probe module 10 will be described in the following paragraphs. Referring to FIGS. 1-6, the method of making the cantilever MEMS probe module 10 includes the following steps.

a) Prepare a circuit substrate 20, which has a first surface 21 on which at least one electric contact 212 is provided, and a second surface 22 opposite to the first surface 21.

Figure 9:
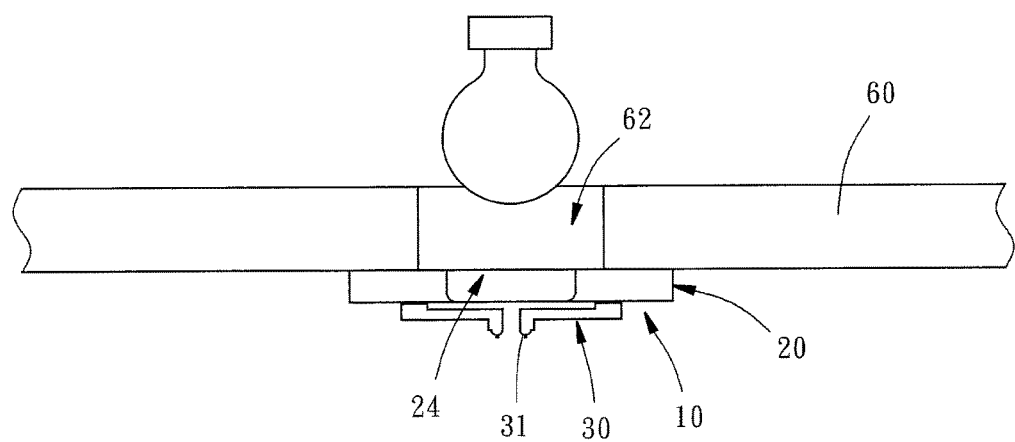
FIG. 9 is a schematically sectional view showing the cantilever MEMS probe module is applied for probing image sensing device.

In appendix drawings, the first surface 21 is directed to the upper surface of the circuit substrate 20 facing upwardly during the manufacturing process of the cantilever MEMS probe module 10, not the upper surface of the circuit substrate 20 when the cantilever MEMS probe module 10 is in use. Generally, the first surface 21, on which the probes 30 are formed, will face downwardly when the cantilever MEMS probe module 10 is in use, as shown in FIG. 9, for downwardly contacting DUTs (not shown in the drawings). For facilitating fabrication of the probes 30 on the first surface 21, the circuit substrate 20 is positioned in a manner that the first surface 21 faces upwardly during whole manufacturing process. To simplify sketching, the shape of the needle 31 in FIG. 1 is not shown completely corresponding to the shape of the needle 31 in FIG. 2, and it is to be understood that the shape of the needle 31 is not limited to a specific shape in the present invention.

Figure 3:
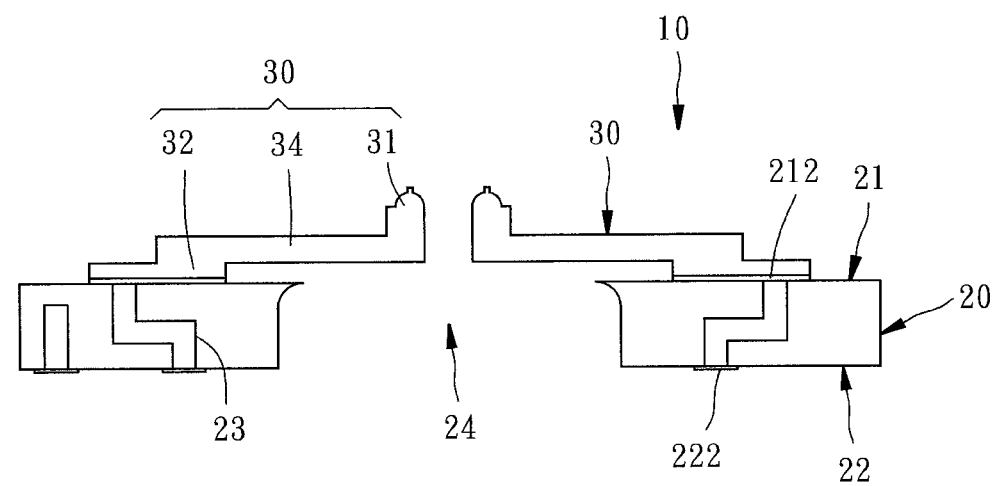
FIG. 3 is similar to FIG. 2, but showing an alternate arrangement of electric contacts and connecting circuits of a circuit substrate.

In practice, the first and second surfaces 21, 22 of the circuit substrate 20 are respectively provided with a plurality of electric contacts 212, 222, and a plurality of connecting circuits 23 are provided inside the circuit substrate 20 between the first and second surfaces 21, 22. In the drawings of the present invention, the electric contacts 212, 222 and the connecting circuits 23 are schematically drawn with an enlarged scale for illustrative purpose. The electric contacts 212, 222 are in fact quite thin and will almost not protrude over the first and second surfaces 21, 22, so that the first and second surfaces 21, 22 are substantially flat. The electric contacts 212 of the first surface 21 may be, but not limited to, electrically connected with the electric contacts 222 of the second surface 22 through the connecting circuits 23. For the circuit substrate 20, a multilayer ceramic board (MLC), a multilayer organic board (MLO), or a printed circuit board (PCB) may be used. The shapes of the contacts 212, 222 and the connecting circuits 23 are not limited to specific ones, and may be, for example, the shapes as shown in FIG. 3. Further, in this step a) the circuit substrate 20 has flat and complete first and second surfaces 21 and 22, as shown in FIG. 4.

b) Utilize a MEMS fabrication process to form at least one cantilever MEMS probe 30 on the first surface 21 of the circuit substrate 20. The cantilever MEMS probe 30 is configured having a support post 32 electrically and mechanically connected with the electric contact 212 of the first surface 21, a cantilever arm 34 monolithically connected with the support post 32 and extending horizontally, and a needle 31 monolithically connected with the cantilever arm 34 and extending upwardly.

Figure 4:
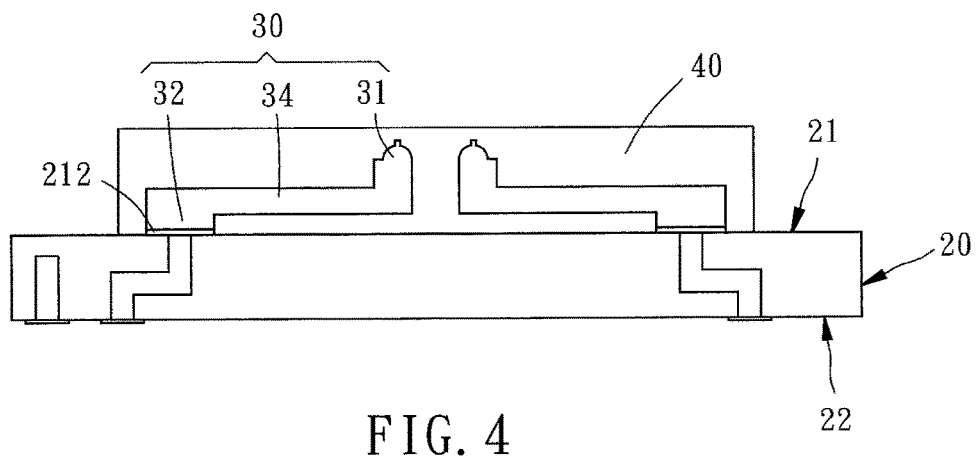
FIGS. 4-6 are sectional views showing steps of a method of making the cantilever MEMS probe module according to the first preferred embodiment.

As shown in FIG. 4, because the first surface 21 is substantially a flat and complete plane, the MEMS fabrication process of the step b) can be carried out right after the step a). The MEMS fabrication process of the step b) includes, but not limited to, the steps of utilizing the conventional photolithography technique to superimpose layer by layer a plurality of sacrifice layers 40 each having one or more openings at predetermined locations thereof and made of removeable metallic or photoresist materials, and then forming each and every part of the cantilever MEMS probes 30, i.e. the support posts 32, cantilever arms 34 and/or the needles 31, in the openings of the respective sacrifice layers by electroplating a metallic material, e.g. nickel-cobalt alloy, in the aforesaid openings layer by layer. Since the MEMS fabrication process is well known in the art and has been discussed in many papers and/or patent applications, such as Taiwan Patent No. I413775, the detail of the MEMS fabrication process will not, and needs not to be described hereunder.

Figure 5:
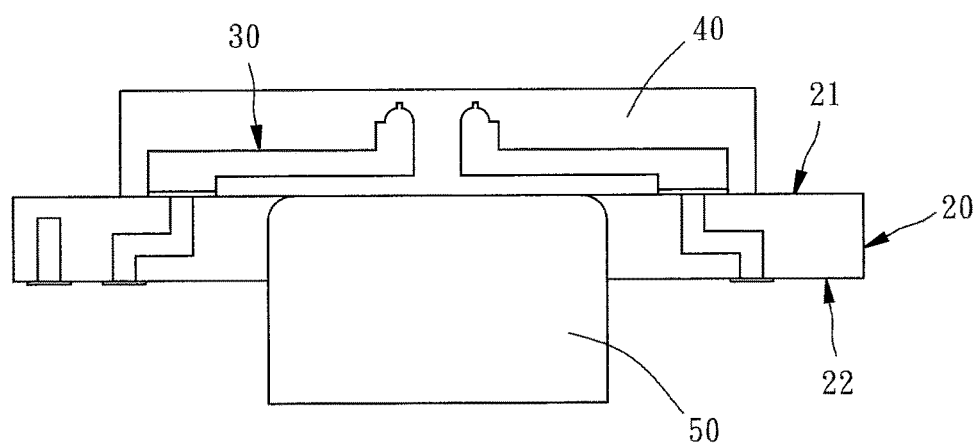
Figure 6:
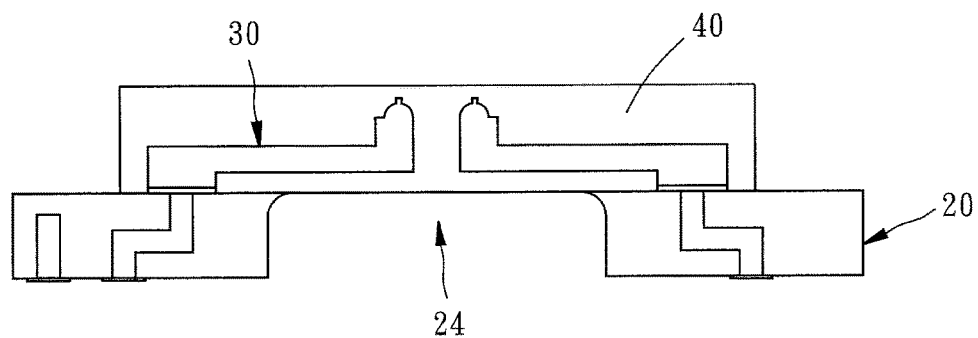

It is worth mentioning that the support post 32 is mainly used to support the cantilever arm 34 at a desired elevation, such that the cantilever arm 34 is spaced at a distance from the first surface 21 of the circuit substrate 20. Further, the shape of the support post 32 is not limited to the shape disclosed in the preferred embodiment. In other words, the support post 32 may be configured having a specific shape in conformity with the shape of the electric contact 212 that is adapted for being electrically and mechanically connected by the support post 32. For example, the support post 32 may have a stepwise profile as shown in FIG. 3.

c) Utilize a cutting tool 50, e g a milling cutter, to cut the circuit substrate 20 from the second surface 22 toward the first surface 21 of the circuit substrate 20 so as to form a through hole 24 penetrating through the first and second surfaces 21, 22 at a position corresponding to the needle 31 and at least a part of the cantilever arm 34, as shown in FIGS. 5 and 6.

In this embodiment, the cantilever MEMS probe 30 is embedded inside the sacrifice layer 40 when the step c) is carried out, and the sacrifice layer 40 is removed after completion of the step c) so as to accomplish a well-produced cantilever MEMS probe module 10 as shown in FIG. 2. In this way, the sacrifice layer 40 can firmly secure the cantilever MEMS probe 30 on the circuit substrate 20 during the process of the step c) to facilitate the machining process and to avoid the cantilever MEMS probe 30 from deformation and/or damage. However, it is to be noted that the sacrifice layer 40 may be removed before the step c) is carried out.

Figure 7:
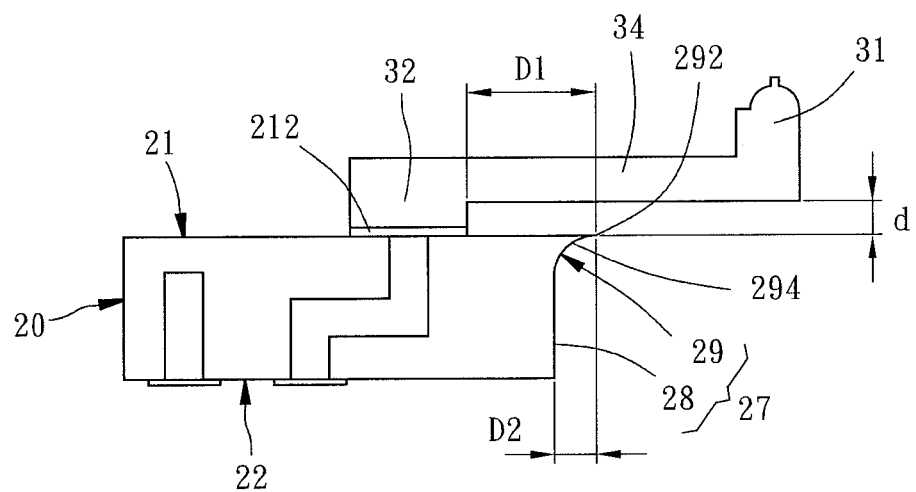
FIG. 7 is an enlarged view of a left part of FIG. 2.
Figure 8:
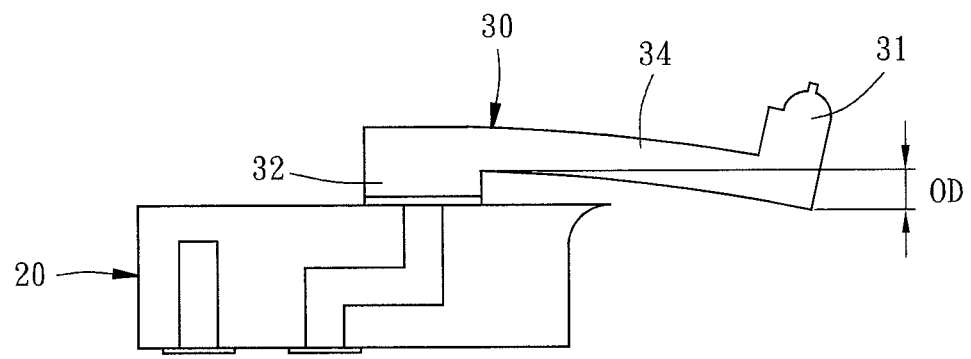
FIG. 8 is similar to FIG. 7, but showing the cantilever MEMS probe is curvedly bent.

As shown in FIGS. 7 and 8, when the probe module 10 is in use, the needle 31 will receive an external force, i.e. a reaction force from the DUT (not shown), resulting in that the cantilever arm 34 is curvedly bent and deformed in a direction toward the circuit substrate 20. Since the circuit substrate 20 is processed with a through hole 24 in the step c), the curvedly bent cantilever arm 34 can be partially received in the through hole 24. Therefore, the support post 32 of the present invention can be made with a shorter height and the cantilever MEMS probe will still not bump against the circuit substrate 20. Specifically speaking, when the cantilever arm 34 receives an external force, the cantilever arm 34 will be curvedly bent with a bending value, which is defined as a distance, e.g. the distance denoted by reference characters OD in FIG. 8, that an end of the cantilever arm 34 moves from an initial position where the cantilever arm 34 receives no external force, as shown in FIG. 7, in a direction toward the through hole 24, and when the external force is released from the cantilever arm 34, the cantilever arm 34 will return back to the initial position as shown in FIG. 7. When the external force exerting on the cantilever arm 34 reaches a threshold value, a part of the curvedly bent cantilever arm 34 will be accommodated in the through hole 24. At this moment, the bending value of the cantilever arm 34 is less than a maximum overdrive OD of the cantilever MEMS probe 30, i.e. less than a maximum probing stroke of the cantilever MEMS probe 30. In this embodiment, the distance d between the cantilever arm 34 that is not bent and the first surface 21, as shown in FIG. 7, is less than the maximum overdrive OD of the cantilever MEMS probe 30, as shown in FIG. 8. Preferably, the distance d may be less than 100 micrometers. When the cantilever MEMS probe 30 reaches the maximum overdrive OD, the bending value of the cantilever arm 34 at the fee end of the cantilever arm 34, i.e. the maximum overdrive OD, may be greater than one half the total height of the support post 32. In this embodiment, it is greater than the total height of the support post 32.

When the step b) is carried out, a plurality of sacrifice layers are formed layer by layer subject to the profile of the probe 30 (i.e. the sacrifice layer 40 is composed of a number of sacrifice layers laminated together), and a part of the probe 30 is formed in respective sacrifice layer by electroplating, i.e. the probe 30 is formed part by part upon building the sacrifice layer 40 layer by layer. Under this circumstance, it can be easily understood that the cantilever MEMS probe 30 of the present invention, which has a support post 32 shorter than the support post of a conventional cantilever MEMS probe, can be made quicker than the conventional cantilever MEMS probe by the aforesaid MEMS fabrication process. In fact, the cantilever MEMS probe module of the present invention can be made in about one half the manufacturing time of the conventional cantilever MEMS probe module. Further, by means of the method of the present invention, the work of processing concave slot on the first surface 21 of the circuit substrate 20 and then filling up the concave slot is not needed before performing the step b), and therefore the work of removing the filling materials from the concave slot is also not needed after completion of the probe 30. As such, the cantilever MEMS probe 10 of the present invention can be made having a short support post 32 of the cantilever MEMS probe 30, which can still prevent the cantilever arm 34 from bumping against the circuit substrate 20, in a convenient, time-saving and low-cost way.

FIG. 9 shows that the cantilever MEMS probe module 10 is cooperated with a circuit board 60 to form a probe card. The circuit board 60 is provided with a through hole 62 in alignment with the through hole 24 of the probe module 10, such that a testing light may pass through the through holes 62, 24 and then radiate on the needles 31. In other words, the probe module 10 is suitable for the testing of the image sensing device (not shown).

Figure 10:
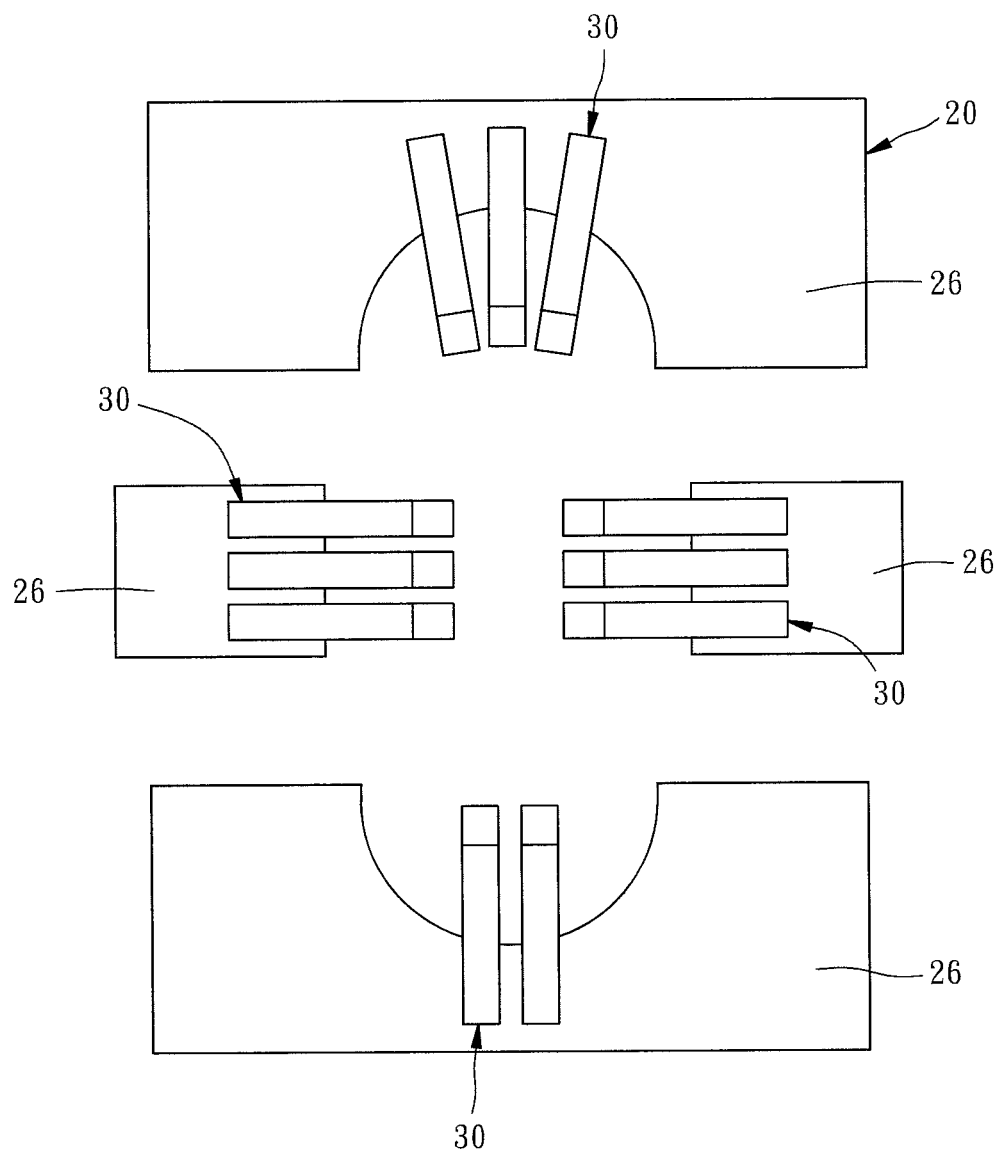
FIG. 10 is a schematic view showing that the cantilever MEMS probe module of FIG. 1 is cut into four substrate blocks.

In the preferred embodiment, the probe module 10 is equipped with a plurality of cantilever MEMS probes 30, which are simultaneously formed by the MEMS fabrication process in the step b). As shown in FIG. 10, after completion of the step c) the circuit substrate 20 can be cut into a plurality of substrate blocks 26, on each of which one or more cantilever MEMS probes 30 are attached. As such, the probe module 10 is divided into a plurality of small-sized probe modules. These small-sized probe modules are made in accordance to the above-mentioned steps a) to c) and a cutting step for singularization, thereby enhancing manufacturing efficiency thereof.

As shown in FIGS. 5 to 7, in the step c) of the present embodiment, the cutting tool 50 creates a wall 27 surrounding the through hole 24 and having a flat portion 28 adjacent to the second surface 22 of the circuit substrate 20, and a relatively protruded portion 29 relative to the flat portion 28. The relatively protruded portion 29 includes a tip portion 292 adjacent to the first surface 21, and a guiding surface 294 extending from the tip portion 292 to the flat portion 28 in such a way that the diameter of the through hole 24 gradually increases from the tip portion 292 along the guiding surface 294 and becomes substantially a constant at the flat portion 28. That is, the through hole 24 has substantially a uniform diameter at the flat portion 28 thereof. In the present embodiment, the guiding surface 294 is an arched surface; however, the profile of the guiding surface 294 is not limited to the one disclosed in this embodiment as long as the feature that the diameter of the through hole 24 gradually increases from the tip portion 292 along the guiding surface 294 exists. With this feature, when a probe cleaning work is carried out, compressed gas flowing through the through hole 24 will be conducted and directed by the guiding surface 294 to the needle 31, thereby enhancing the probe cleaning effect.

Figure 11:
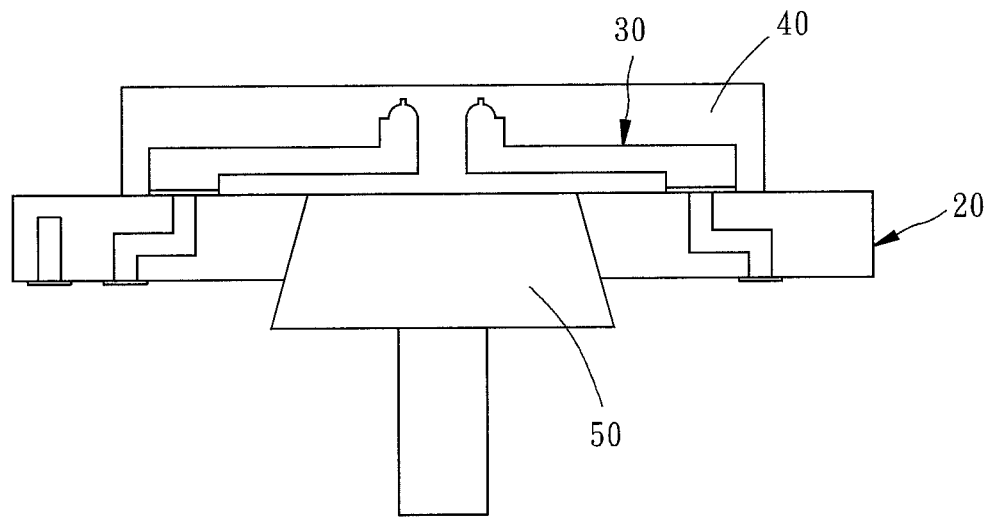
FIG. 11 is similar to FIG. 5, but schematically showing a step c) of a method of making a cantilever MEMS probe module according to a second preferred embodiment of the present application.
Figure 12:
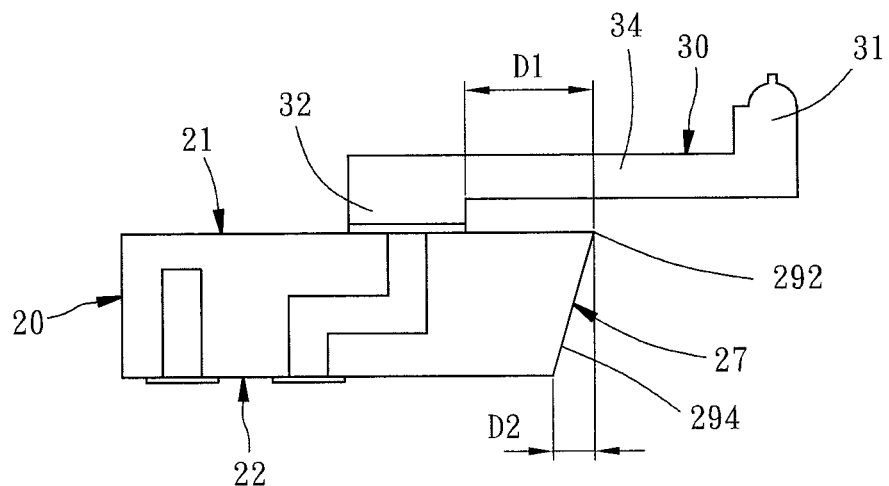
FIG. 12 is a sectional view showing a left part of the cantilever MEMS probe module according to the second preferred embodiment.

The though hole 24 of the circuit substrate 20 can be formed by other cutting tools having specific shape so as to form a wall 27 having a specific shape that can direct cleaning gas to the needle 31. For example, FIGS. 11 and 12 show a probe module according to a second preferred embodiment of the present invention, in which the cutting tool 50 forms a wall 27 of a through hole 24, which has a tip portion 292 adjacent to the first surface 21, and a linearly inclined flat surface extending from the tip portion 292 to the second surface 22 and serving as the guiding surface 294 capable of guiding cleaning gas and enhancing the probe cleaning effect. As shown in FIG. 12, the diameter of the through hole 24 gradually increases from the tip portion 292 along the guiding surface 294 too.

FIGS. 7 and 12 show an optimal design of the through hole 24, in which a distance D1 between the tip portion 292 and the support post 32 of the cantilever MEMS probe 30 is less than 600 micrometers, and a difference D2 between a maximum radius and a minimum radius of the through hole 24 is greater than 40 micrometers and less than 200 micrometers. In this way, a short support post 32 with a satisfied overdrive of the cantilever MEMS probe can be realized.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of making a probe module, comprising the steps of:
   a) providing a circuit substrate having a first surface on which an electric contact is provided, and a second surface opposite to the first surface;
   b) forming a cantilever MEMS probe on the first surface of the circuit substrate by a MEMS fabrication process in a way that the cantilever MEMS probe has a support post electrically and mechanically connected with the electric contact of the first surface, a cantilever arm connected with the support post, and a needle connected with the cantilever arm; and
   c) forming a through hole penetrating through the first and second surfaces of the circuit substrate in a way that the through hole is in alignment with the needle and a part of the cantilever arm such that the needle and the part of the cantilever arm are located right above the through hole by using a cutting tool to cut the circuit substrate from the second surface toward the first surface.

2. The method as claimed in claim 1, wherein in the step c) the through hole of the circuit substrate is surrounded by a wall cut by the cutting tool, and the wall has a tip portion adjacent to the first surface of the circuit substrate, and a guiding surface extending from the tip portion towards the second surface of the circuit substrate in a way that a diameter of the through hole of the circuit substrate gradually increases from the tip portion along the guiding surface.

3. The method as claimed in claim 2, wherein the guiding surface is an arched surface or a flat surface.

4. The method as claimed in claim 1, wherein in the step b) a sacrifice layer is formed on the first surface of the circuit substrate; the cantilever MEMS probe is held by the sacrifice layer when the step c) is carried out, and the sacrifice layer is removed after the step c).

5. The method as claimed in claim 1, where in the step b) a plurality of said cantilever MEMS probes are formed on the first surface of the circuit substrate, and after the step c) the circuit substrate is cut into a plurality of substrate blocks each having at least one of said cantilever MEMS probes.

6. A probe module, comprising:
   a circuit substrate having a first surface on which an electric contact is provided, a second surface opposite to the first surface, and a through hole penetrating through the first and second surfaces; and
   a cantilever MEMS probe formed on the first surface of the circuit substrate by a MEMS fabrication process, the cantilever MEMS probe having a support post electrically and mechanically connected with the electric contact of the first surface, a cantilever arm connected with the support post, and a needle connected with the cantilever arm;
   wherein the through hole of the circuit substrate is in alignment with the needle and a part of the cantilever atm such that the needle and the part of the cantilever arm are located right above the through hole; when the cantilever arm of the cantilever MEMS probe receives an external force, the cantilever arm is curvedly bent with a bending value, which is defined as a distance that an end of the cantilever arm moves towards the second surface of the circuit substrate, and partially received in the through hole of the circuit substrate.

7. The probe module as claimed in claim 6, wherein the through hole of the circuit substrate is surrounded by a wall having a tip portion adjacent to the first surface of the circuit substrate, and a guiding surface extending from the tip portion towards the second surface of the circuit substrate in a way that a diameter of the through hole of the circuit substrate gradually increases from the tip portion along the guiding surface.

8. The probe module as claimed in claim 7, wherein the guiding surface is an arched surface or a flat surface.

9. The probe module as claimed in claim 7, wherein the wall of through hole of the circuit substrate has a flat portion adjacent to the second surface of the circuit substrate with a uniform diameter; the guiding surface is an arched surface extending from the tip portion to the flat portion.

10. The probe module as claimed in claim 7, wherein the guiding surface is a flat surface extending from the tip portion to the second surface of the circuit substrate.

11. The probe module as claimed in claim 7, wherein the through hole of the circuit substrate has a maximum radius and a minimum radius, and a difference between the maximum radius and the minimum radius is greater than 40 micrometers and less than 200 micrometers.

12. The probe module as claimed in claim 7, wherein a distance between the tip portion of the through hole of the circuit substrate and the support post of the cantilever MEMS probe is less than 600 micrometers.

13. The probe module as claimed in claim 6, wherein when the cantilever arm is not bent, a distance between the cantilever arm and the first surface of the circuit substrate is less than a maximum overdrive of the cantilever MEMS probe.

14. The probe module as claimed in claim 13, wherein the distance between the cantilever arm and the first surface of the circuit substrate is less than 100 micrometers.

* * * * *